US012580167B2

(12) United States Patent
Kim

(10) Patent No.: US 12,580,167 B2
(45) Date of Patent: Mar. 17, 2026

(54) MODULE FOR MEASURING CURRENT/VOLTAGE/POWER OF PLASMA APPARATUS AND PLASMA APPARATUS INCLUDING THE SAME

(71) Applicant: KOREA INSTITUTE OF FUSION ENERGY, Daejeon (KR)

(72) Inventor: Jongsik Kim, Gunsan-si (KR)

(73) Assignee: Koreas Institute of Fusion Energy, Daejeon (KR)

( * ) Notice: Subject to any disclaimer, the term of this patent is extended or adjusted under 35 U.S.C. 154(b) by 162 days.

(21) Appl. No.: 18/427,460

(22) Filed: Jan. 30, 2024

(65) Prior Publication Data

US 2024/0266156 A1 Aug. 8, 2024

(30) Foreign Application Priority Data

Feb. 6, 2023 (KR) ........................ 10-2023-0015658

(51) Int. Cl.
| | |
|---|---|
| *H01J 37/32* | (2006.01) |
| *H01P 5/18* | (2006.01) |
| *H03H 7/01* | (2006.01) |
| *H03H 7/06* | (2006.01) |

(52) U.S. Cl.
CPC .... *H01J 37/3299* (2013.01); *H01J 37/32091* (2013.01); *H01J 37/321* (2013.01); *H01P 5/182* (2013.01); *H03H 7/06* (2013.01); *H03H 7/1791* (2013.01); *H01J 2237/24564* (2013.01)

(58) Field of Classification Search
None
See application file for complete search history.

(56) References Cited

U.S. PATENT DOCUMENTS

| | | | | |
|---|---|---|---|---|
| 6,717,428 B1* | 4/2004 | Spica | ................. | G01R 31/2837 |
| | | | | 324/762.01 |
| 8,400,179 B1* | 3/2013 | Hulbert | .............. | G01R 31/2837 |
| | | | | 324/762.01 |
| 9,378,931 B2* | 6/2016 | Kwon | ............... | H01J 37/32146 |
| 9,502,209 B2* | 11/2016 | Yue | ..................... | H01J 37/3171 |

(Continued)

FOREIGN PATENT DOCUMENTS

| | | |
|---|---|---|
| JP | 2019078563 A | 5/2019 |
| JP | 2022523807 A | 4/2022 |

(Continued)

*Primary Examiner* — Srinivas Sathiraju
(74) *Attorney, Agent, or Firm* — Rabin & Berdo, P.C.

(57) ABSTRACT

Provided is a module for measuring current/voltage/power of a plasma apparatus, which includes a process chamber having a sealed processing space in which plasma is formed to process a substrate; a substrate support unit disposed in the processing space and on which a substrate is seated; and a gas injection unit configured to inject gas for performing a process in the processing space, wherein, in a substrate processing apparatus configured to process the substrate by applying RF power to the process chamber, the gas support unit, and the gas injection unit, the module for measuring current/voltage/power of the plasma apparatus is disposed adjacent to at least one application line among a first power application line for applying the RF power and a ground line for grounding to measure a RF voltage, current, and power of an input wave and a reflected wave generated by plasma generated in the processing space.

20 Claims, 10 Drawing Sheets

(56) References Cited

U.S. PATENT DOCUMENTS

| | | | | |
|---|---|---|---|---|
| 9,854,659 | B2 * | 12/2017 | Van Zyl | H01J 37/32082 |
| 10,115,567 | B2 * | 10/2018 | Hirano | H01J 37/32183 |
| 10,194,518 | B2 * | 1/2019 | Van Zyl | H01J 37/32082 |
| 11,610,763 | B2 * | 3/2023 | Van Zyl | H01J 37/32183 |
| 11,664,196 | B2 * | 5/2023 | Koshimizu | H01J 37/32706 |
| | | | | 315/111.21 |
| 11,728,137 | B2 * | 8/2023 | Wang | H01J 37/32165 |
| | | | | 315/111.21 |
| 11,804,362 | B2 * | 10/2023 | Van Zyl | H01J 37/32183 |
| 12,051,565 | B2 * | 7/2024 | Kim | H01J 37/32183 |
| 2012/0019267 | A1 | 1/2012 | Tabuchi | |
| 2014/0002118 | A1 * | 1/2014 | Gaggl | G01R 31/129 |
| | | | | 324/750.01 |
| 2015/0137006 | A1 * | 5/2015 | Yue | H01J 37/305 |
| | | | | 250/453.11 |
| 2015/0348746 | A1 * | 12/2015 | Yue | H01J 37/3056 |
| | | | | 250/453.11 |
| 2015/0362539 | A1 * | 12/2015 | Chou | G01R 27/025 |
| | | | | 324/762.01 |
| 2016/0079037 | A1 * | 3/2016 | Hirano | H01J 37/32183 |
| | | | | 156/345.28 |
| 2016/0111259 | A1 * | 4/2016 | Van Zyl | H01J 37/32935 |
| | | | | 315/111.21 |
| 2016/0282440 | A1 * | 9/2016 | Tanaka | G01R 21/01 |
| 2016/0307738 | A1 * | 10/2016 | Marakhtanov | H01J 37/32183 |
| 2017/0016953 | A1 * | 1/2017 | Beer | G01R 27/28 |
| 2018/0077788 | A1 * | 3/2018 | Van Zyl | H05H 1/46 |
| 2018/0231587 | A1 * | 8/2018 | Ye | H01J 37/32174 |
| 2018/0358208 | A1 * | 12/2018 | Ma | H01J 37/3244 |
| 2021/0005431 | A1 * | 1/2021 | Ma | H01L 21/31138 |
| 2024/0021410 | A1 * | 1/2024 | Zhao | H01J 37/32541 |
| 2024/0266156 | A1 * | 8/2024 | Kim | H01P 5/182 |
| 2024/0312766 | A1 * | 9/2024 | Zhao | H01J 37/32183 |
| 2024/0361377 | A1 * | 10/2024 | Lloyd | G01R 31/2841 |

FOREIGN PATENT DOCUMENTS

| | | | |
|---|---|---|---|
| KR | 1020050009889 | A | 1/2005 |
| KR | 1020160039009 | A | 4/2016 |

* cited by examiner

FIG. 4A

MODULE FOR MEASURING CURRENT/VOLTAGE/POWER OF PLASMA APPARATUS AND PLASMA APPARATUS INCLUDING THE SAME

CROSS-REFERENCE TO RELATED APPLICATIONS

This U.S. non-provisional patent application claims priority under 35 U.S.C. § 119 of Korean Patent Application No. 10-2023-0015658, filed on Feb. 6, 2023, the entire contents of which are hereby incorporated by reference.

BACKGROUND

The present disclosure relates to a plasma apparatus, and more particularly, to a module for measuring current/voltage/power of a plasma apparatus, which measures current/voltage applied for generating and maintaining plasma while a substrate is processed by using plasma and further measures power of an incident wave and a reflected wave and a plasma apparatus including the same.

A plasma apparatus refers to an apparatus that processes a substrate by forming a plasma state in a sealed processing space.

Also, the plasma apparatus may have a plasma source having various structures such as CCP and ICP according to a plasma formation principle.

For example, as shown in FIG. 1, the plasma apparatus generally includes: a process chamber 10 that forms a sealed processing space S in which plasma is formed to process a substrate; a substrate support unit 11 which is disposed in the processing space S and on which a substrate W is placed; and a gas injection unit 12 that injects gas for performing a process into the processing space S.

On the other hand, various methods for monitoring the plasma state to control plasma formed in the processing space S is suggested to perform uniform substrate processing process and reproducible process.

A VI probe is provided as a unit for directly measuring the plasma state generated in the processing space S of a substrate processing apparatus. Although the conventional VI probe secures accuracy of RF voltage/current measurement, the conventional VI probe may not secure reliability for transmission power measurement by using a conventional technology that measures phase difference from the RF voltage/current measurement and calculates transmission power using IV cos(θ).

That is, the conventional commercialized transmission power measurement method (VI probe) using the phase difference, which is used to measure the plasma state generated in the processing space S of the substrate processing apparatus has difficulty in measuring and controlling the RF power transmitted to the plasma.

SUMMARY

The present disclosure provides a module for measuring current/voltage/power of a plasma apparatus, which is configured to have both capacitor and inductance properties to detect a phase difference of voltage and current for RF power measurement, i.e., amount of each of forward power and reflect power, i.e., scalar value, instead of vector value and a plasma apparatus including the same.

The present disclosure also provides a unit for measuring a RF power input into a processing space S as four parameters such as RF power, current, forward power, and reflect power by using one module.

An embodiment of the present invention provides a module for measuring current/voltage/power of a plasma apparatus, including: a process chamber 10 having a sealed processing space S in which plasma is formed to process a substrate; a substrate support unit 11 which is disposed in the processing space S and on which a substrate W is seated; and a gas injection unit 12 configured to inject a gas for performing a process in the processing space S, in which, in a substrate processing apparatus configured to process the substrate by applying at least one RF power 30 to at least one of the process chamber 10, the gas support unit 11, and the gas injection unit 12, the module for measuring current/voltage/power of the plasma apparatus is disposed adjacent to at least one application line 100 among a first power application line 110 for applying the RF power 30 and a ground line 120 for grounding to measure a RF voltage, current, and power of an input wave and a reflected wave generated by plasma generated in the processing space S.

In an embodiment, the module may further include: a first directional coupler 300 disposed adjacent to the application line 100 to measure the power output by the input wave; a second directional coupler 400 disposed adjacent to the application line 100 to measure the power output by the reflected wave; a voltage measurement unit 500 disposed adjacent to the application line 100 to measure the RF voltage by using capacitance; and a current measurement unit 600 disposed adjacent to the application line 100 to measure the RF current by using inductance.

In an embodiment, the first directional coupler 300 and the second directional coupler 400 may include inductance elements 411 and 412 having different winding directions.

In an embodiment, the first directional coupler 300 may include: a LC combination circuit part 310 in which a capacitance element 311 and an inductance element 312, which are disposed adjacent to the application line 100 and interact with the application line 100, are combined and which is wound based on a direction of the incident wave flowing through the application line 100; and a resistance element part 320 including a first reference resistance element 321 having one end that is grounded and the other end connected to one end of the LC combination circuit part 310 and a second reference resistance element 322 having one end connected to a first output port 323 and the other end connected to one end of the LC combination circuit unit 310, and the second directional coupler 400 may include: a LC combination circuit part 410 in which a capacitance element 411 and an inductance element 412, which are disposed adjacent to the application line 100 and interact with the application line 100, are combined and which is wound based on a direction of the reflected wave flowing through the application line 100; and a resistance element part 420 including a third reference resistance element 421 having one end that is grounded and the other end connected to one end of the LC combination circuit part 410 and a fourth reference resistance element 422 having one end connected to a second output port 423 and the other end connected to one end of the LC combination circuit unit 410.

In an embodiment, the first directional coupler 300 may include at least one filter part 330 disposed at a branch point branched between the resistance element part 320 and the LC combination circuit part 310, and the second directional coupler 400 may include at least one filter part 430 installed at a branch point branched between the resistance element part 420 and the LC combination circuit part 410.

In an embodiment, the module may further include a PCB 220 in which an insertion part 210 having an inner diameter greater than an outer diameter of the application line 100 so that at least a portion of the application line 100 is inserted thereto, in which a capacitance element 311 of the first directional coupler 300 and a capacitance element 411 of the second directional coupler 400 may include a plurality of capacitance parts 311a and 411a spaced apart from each other along a circumferential direction on an inner circumferential surface of the insertion part 210, and an inductance element 312 of the first directional coupler 300 and the inductance element 412 of the second directional coupler 400 may include winding parts 340 and 440 passing through the PCB 220 and wound at least one time to connect the capacitance parts 311a and 411a to an end thereof.

In an embodiment, the winding parts 340 and 440 may include metal pattern parts 341 and 441 formed on top and bottom surfaces of the PCB 220 and vertical connection parts 342 and 442 passing through the PCB 220 in a vertical direction to electrically connect the metal pattern parts 341 and 441.

In an embodiment, the voltage measurement unit 500 may include: a capacitance part 510 formed in a circumferential direction at a predetermined angle on at least one of an inner circumferential surface of the insertion part 210 and top and bottom surfaces of an edge of the insertion part 210; and a third output port part 720 connected to the capacitance part 510.

In an embodiment, at least one of a resistance element part 520 and a third filter part 530 may be disposed between a first ground part 740 and a branch point between the capacitance part 510 and the third output port part 720.

In an embodiment, the current measurement unit 600 may include: an inductance part 610 passing through the PCB 220 in concentric with the voltage measurement unit 500 further away from the voltage measurement unit 500 based on the inner circumferential surface of the insertion part 210 and winding at least one time; and a fourth output port part 710 connected to the inductance part 610.

In an embodiment, at least one of the resistance element part 620 and fourth filter part 630 may be disposed between a second ground part 730 and a branch point between the inductance part 610 and the fourth output port part 710.

In an embodiment of the present invention, a plasma apparatus includes: a process chamber 10 having a sealed processing space S in which plasma is formed; and a module for measuring current/voltage/power of the plasma apparatus, which measures a RF voltage, current, and power of an incident wave and a reflected wave generated by plasma generated in the processing space S, in which plasma apparatus is the module for measuring current/voltage/power having the above-described configuration.

In an embodiment, the plasma apparatus may further include: a substrate support unit 11 which is disposed in the processing space S and on which a substrate W is seated; and a gas injection unit 12 configured to inject a gas for performing a process in the processing space S, in which the substrate W may be processed by plasma.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

Figure 4A:
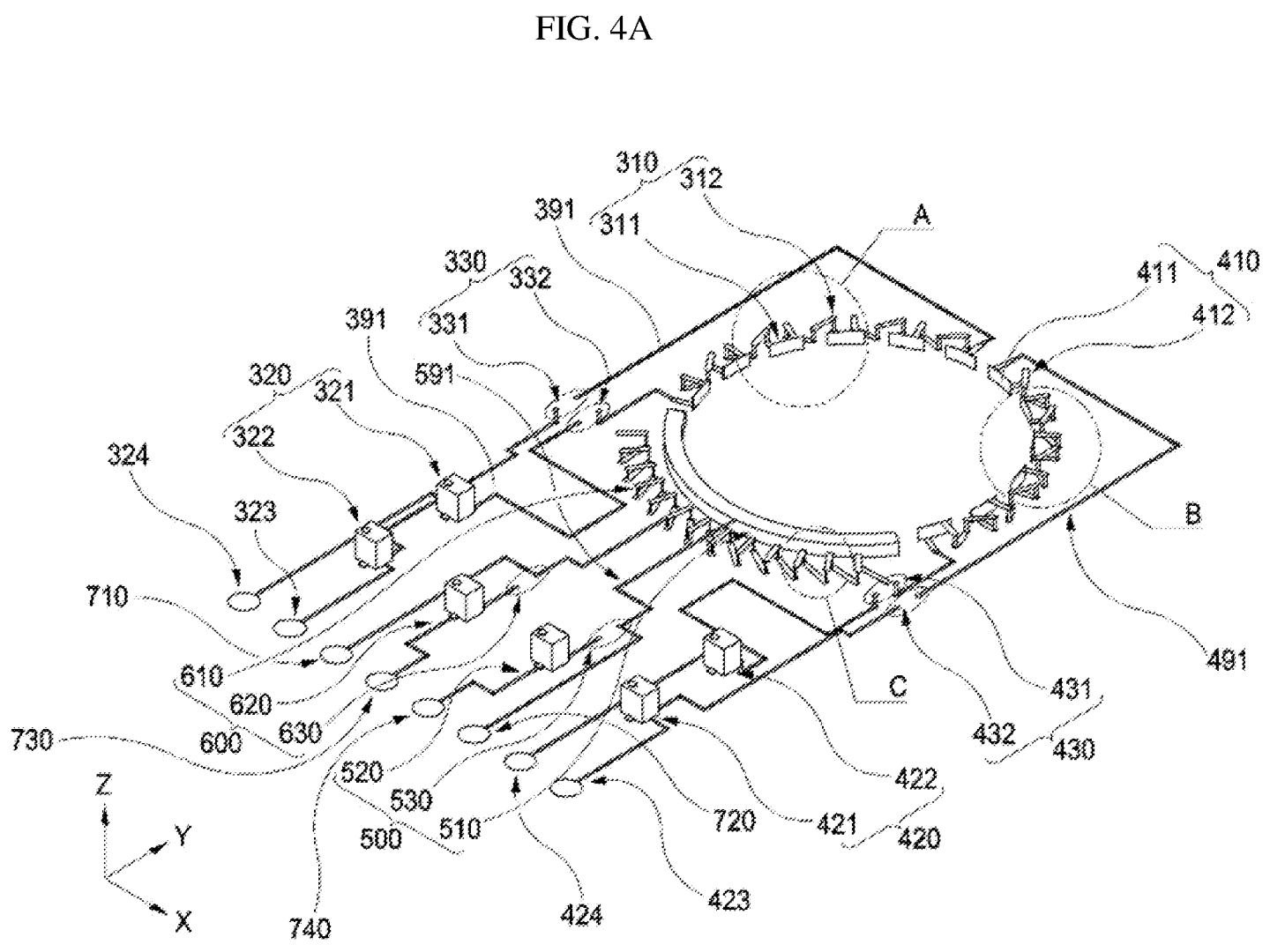

FIG. 4a is a conceptual view illustrating a concept realized into a circuit on the PBC board of FIG. 2;

FIG. 4b is an enlarged perspective view illustrating portion A of FIG. 4a;

FIG. 4c is an enlarged perspective view illustrating portion B of FIG. 4a;

DETAILED DESCRIPTION

Hereinafter, a current/voltage/power measurement module and a plasma apparatus including the same according to the present invention will be described with reference to the accompanying drawings.

First, the plasma apparatus that uses the current/voltage/power measurement module according to the present invention, which is a device that forms plasma to perform a predetermined function, may have various configurations according to use types of the plasma.

For example, the plasma apparatus that uses the current/voltage/power measurement module according to the present invention, which is a device that forms plasma in a processing space S to perform a substrate processing process such as deposition and etching, may have various configurations to form inductively coupled plasma (ICP) and conductibly coupled plasma (CCP).

Figure 1:
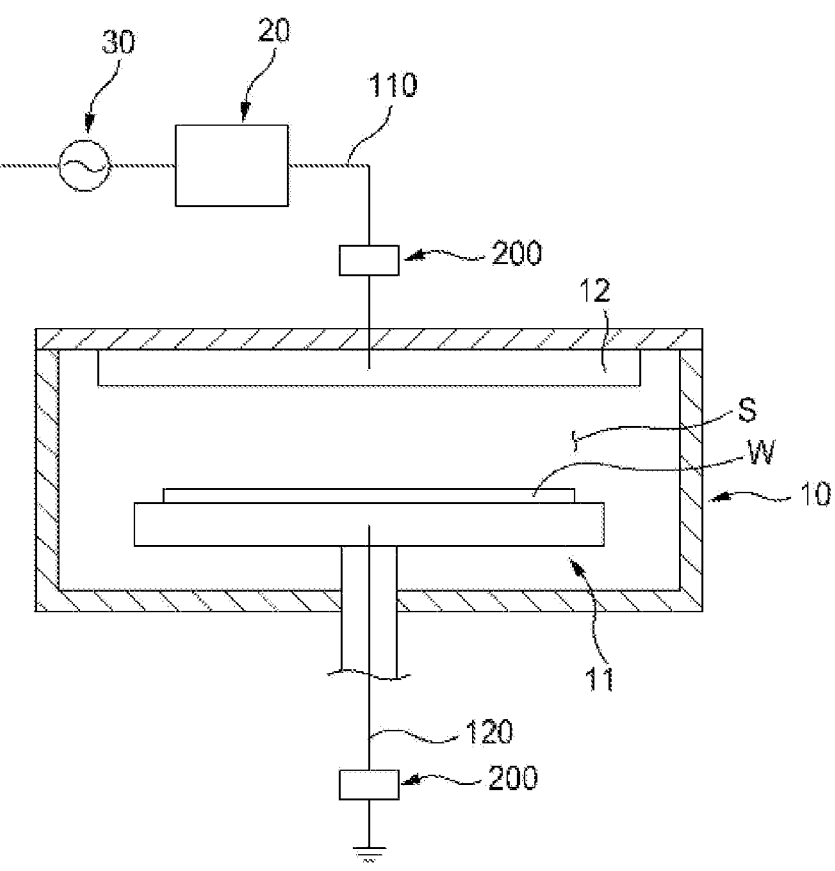
FIG. 1 is a conceptual view illustrating an example of a plasma apparatus in which a current/voltage/power measurement module is installed according to the present invention.
Figure 2:
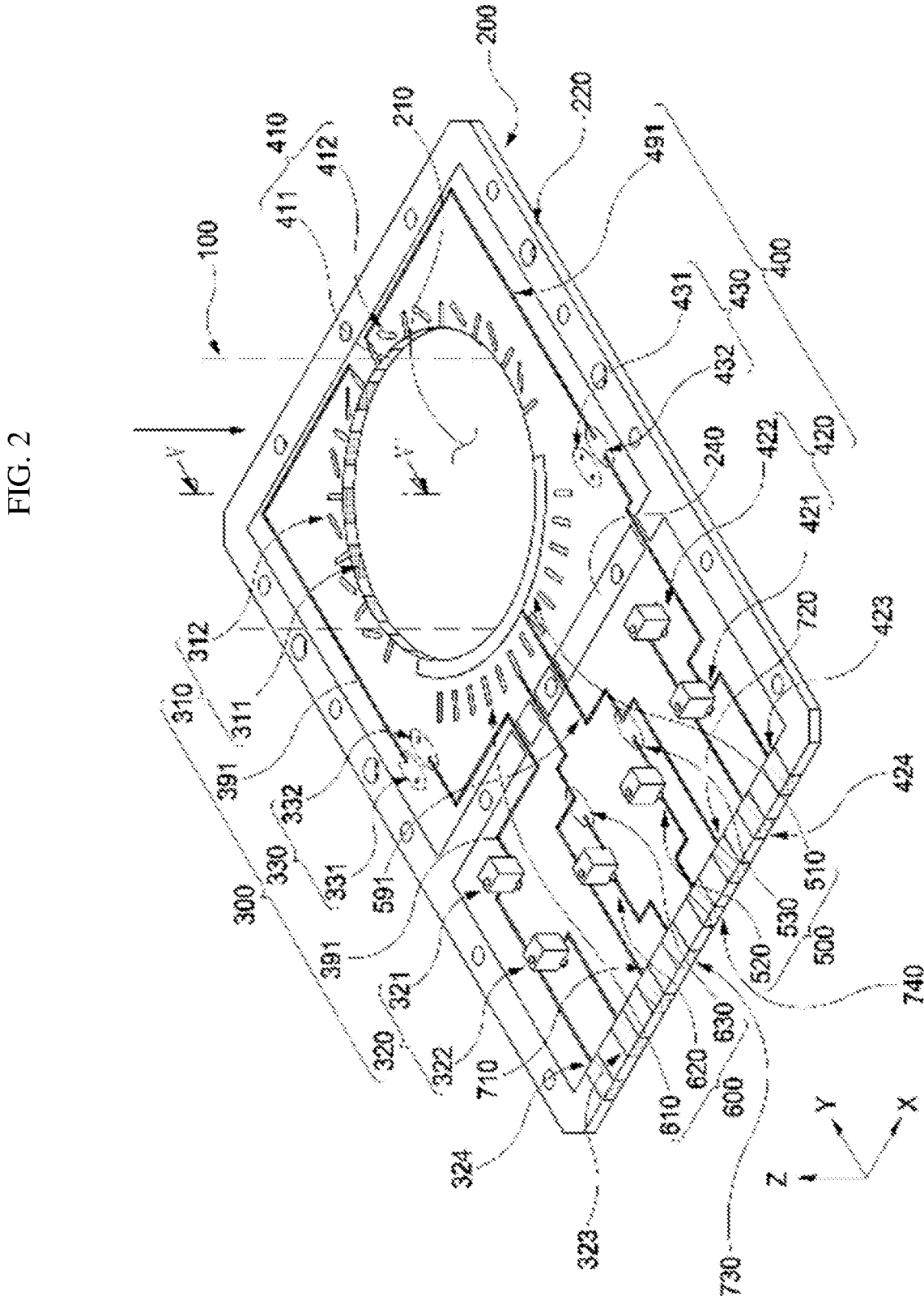
FIG. 2 is a perspective view illustrating an example of a PCB of the current/voltage/power measurement module according to the present invention.
Figure 3A:
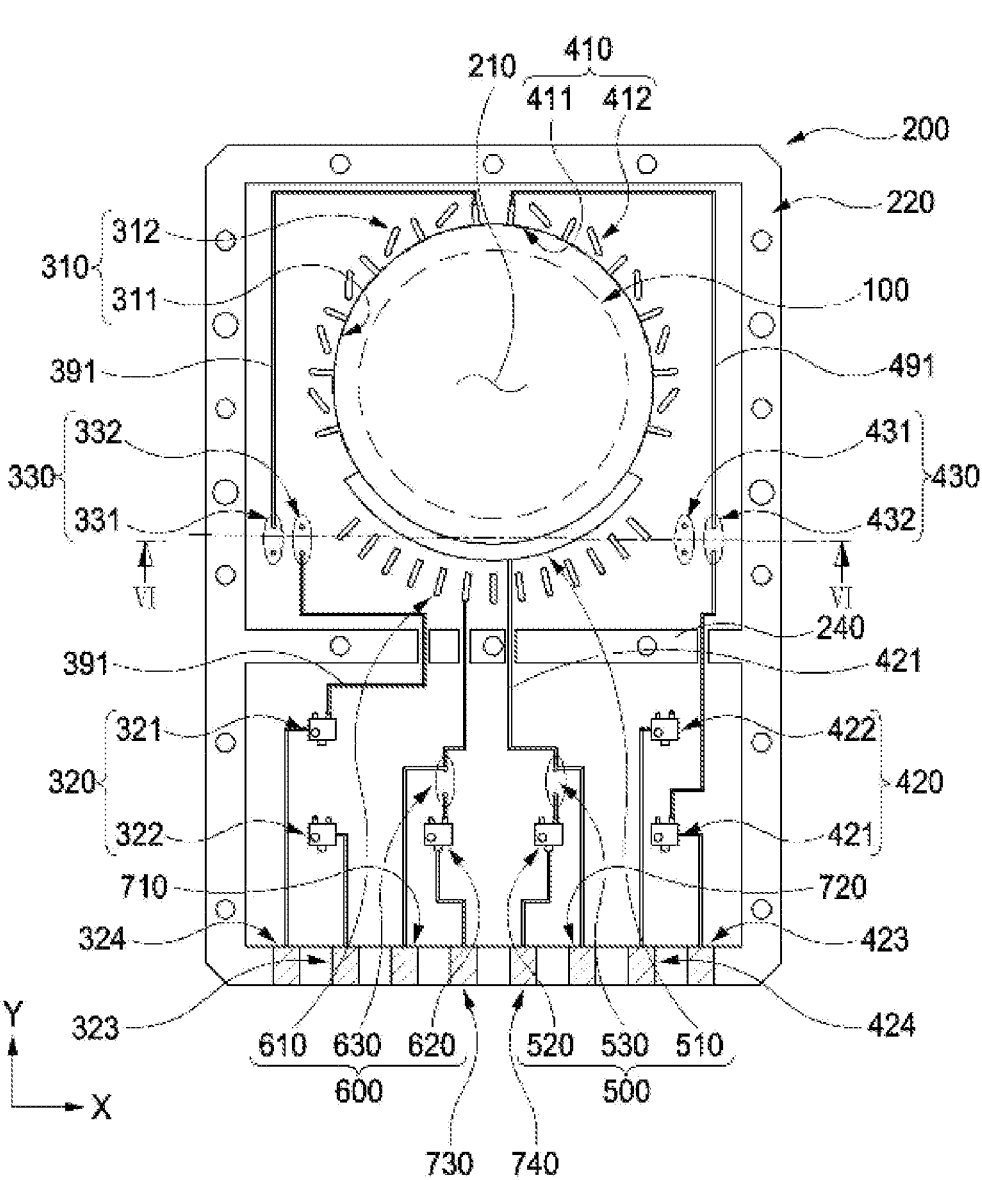
FIGS. 3a and 3b are plan view and rear view illustrating the PCB of FIG. 2, respectively.
Figure 3B:
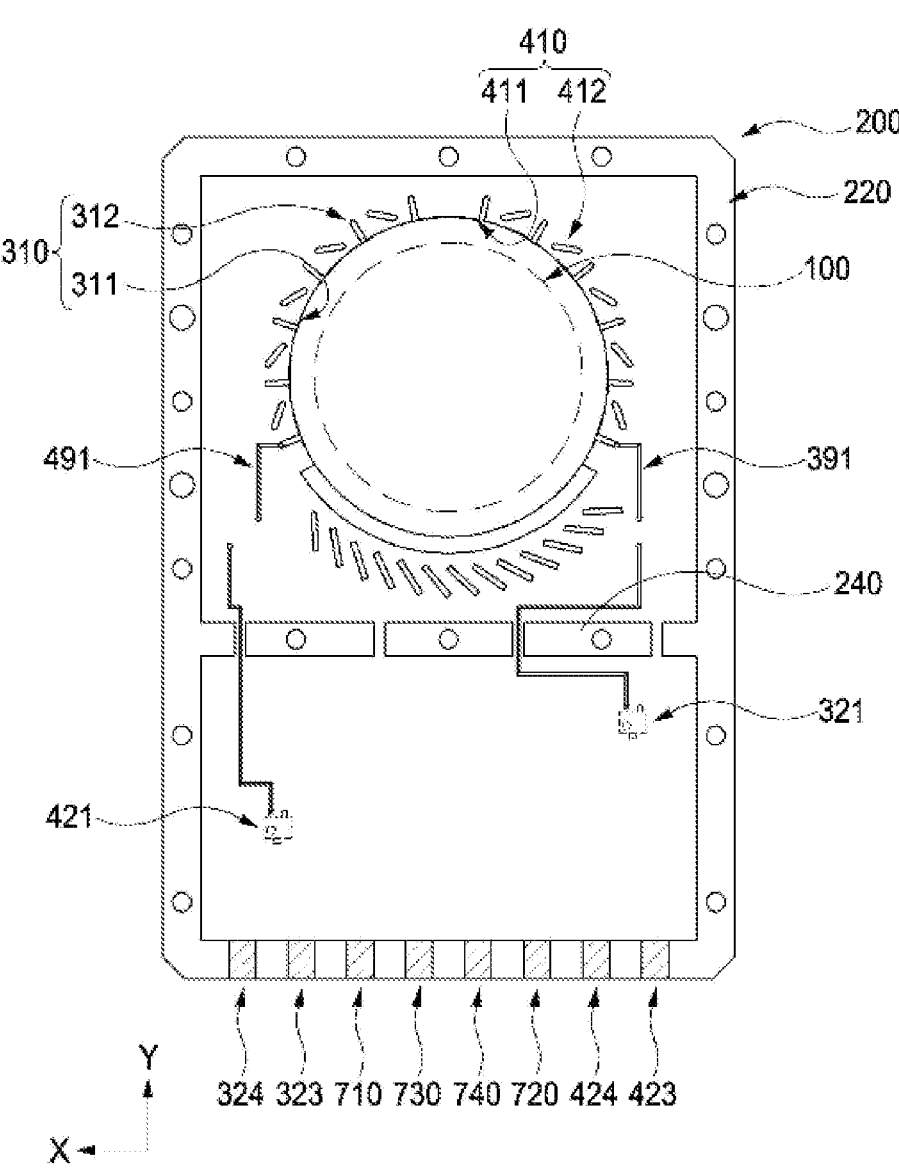
Figure 4B:
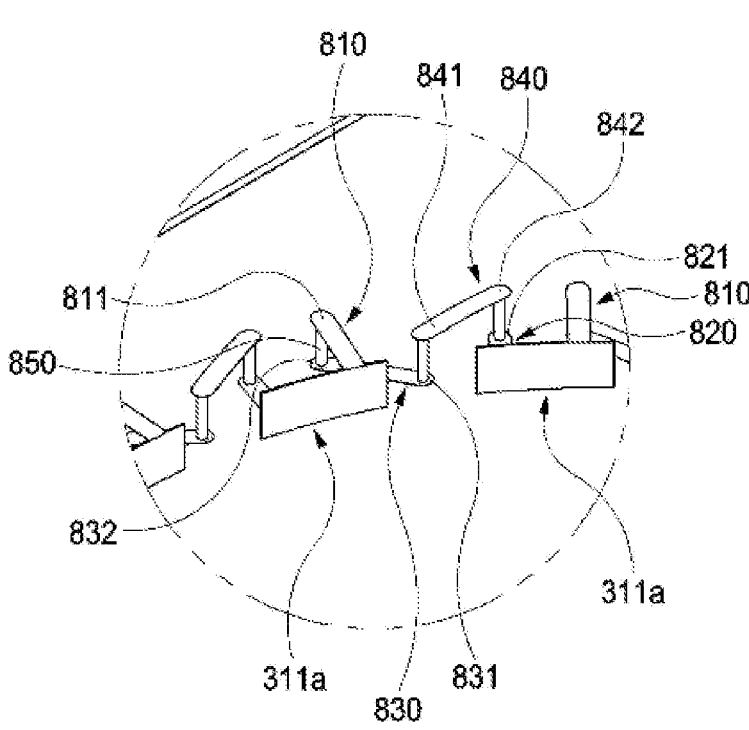
Figure 4C:
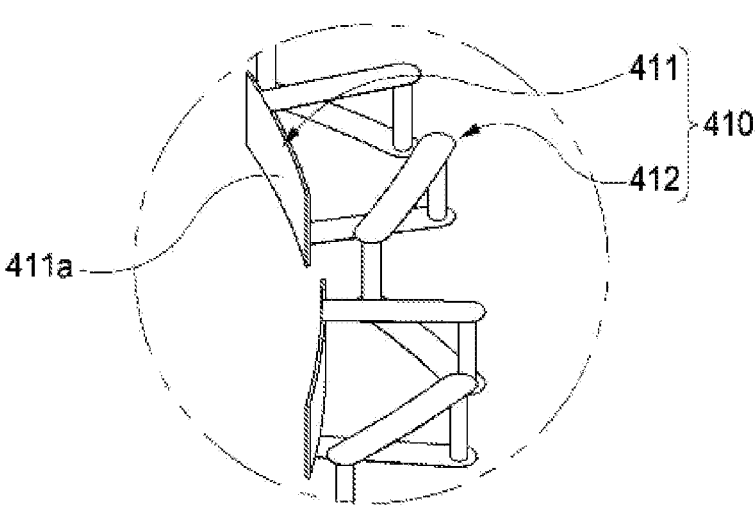
Figure 5:
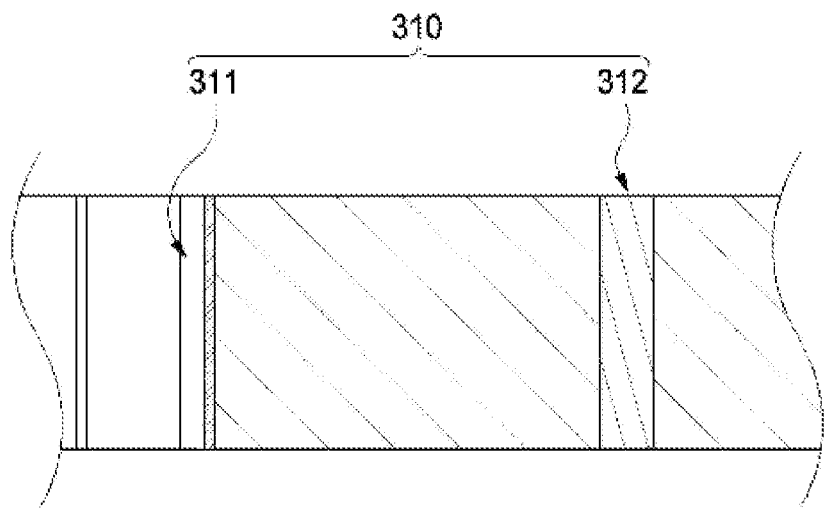
FIG. 5 is a cross-sectional view taken along line V-V of FIG. 2.
Figure 6:
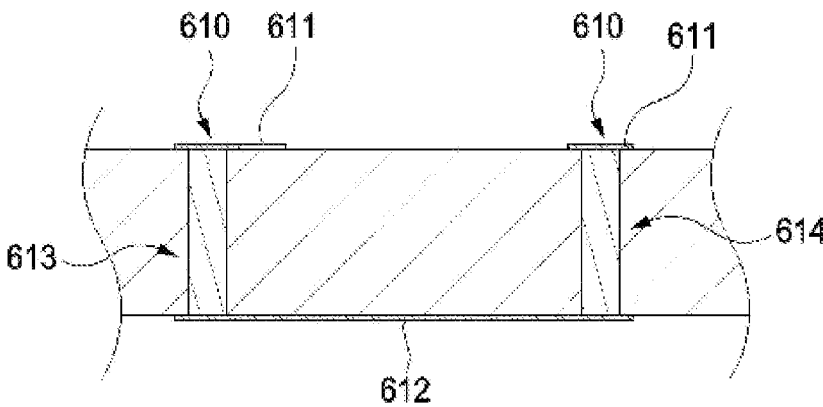
FIG. 6 is a cross-sectional view illustrating an inductance part of a current measurement unit of FIG. 2.

For example, as shown in FIG. 1, the plasma apparatus may include: a process chamber 10 that forms a sealed processing space S in which plasma is formed to process a substrate; a substrate support unit 11 which is disposed in the processing space S and on which a substrate W is seated; and a gas injection unit 12 that injects gas for performing a process into the processing space S.

The process chamber 10 that is a component of forming the sealed processing space S in which the substrate is processed may have various configurations.

For example, the process chamber 10 may include a container in which the processing space S is formed and an upper lid detachably coupled to an upper side of the container.

The substrate support unit 11 that is a component which is installed in the processing space S and on which the substrate W is seated may include various configurations.

For example, the substrate support unit 11 may include a susceptor on which the substrate W is seated and a support shaft extending from a bottom surface of the susceptor to support the susceptor.

The gas injection unit 12 that is a component of injecting gas for performing a process into the processing space S may include various configurations depending on a gas injection structure.

For example, the gas injection unit 12 may include a shower head that injects one or more gases supplied through a gas supply pipe disposed thereabove in a downward direction.

On the other hand, the plasma apparatus processes the substrate by applying at least one RF power 30 to at least one of the process chamber 10, the gas support unit 11, and the gas injection unit 12.

To this end, at least one RF power 30 is applied to at least one of the process chamber 10, the gas support unit 11, and the gas injection unit 12, and a matching network 20 is installed between the RF power 30 and a power supply line 110.

Also, the RF power 30 may apply at least one RF power such as high frequency power and low frequency power depending on process conditions.

On the other hand, the plasma apparatus according to the present invention may have various configurations depending on use types thereof. The plasma apparatus according to the present invention may include the process chamber 10 that forms the sealed processing space S in which plasma is formed as an essential component and further include the gas injection unit 12 and the substrate support 11 as an auxiliary component.

That is, the plasma apparatus according to the present invention may include: the process chamber 10 that forms the sealed processing space S in which plasma is formed; and the current/voltage/power measurement module that measures a RF voltage, current, and power of an incident wave and a reflected wave generated by the plasma generated in the processing space S.

Also, the plasma apparatus may further include: the substrate support unit 11 which is disposed in the processing space S and on which the substrate W is seated; and the gas injection unit 12 that injects one or more gases for performing a process. Here, the substrate W may be processed by plasma.

As shown in FIG. 1, the current/voltage/power measurement module 200 according to the present invention is disposed adjacent to at least one application line 100 of a first power supply line 110 for applying the RF power 30 and a ground line 120 for grounding and measures the RF voltage, current, and power of the incident wave and reflected wave generated by the plasma generated in the processing space S.

Here, the current/voltage/power measurement module 200 according to the present invention may have various configurations depending on current, voltage, and particularly power measurement principles.

Figure 7:
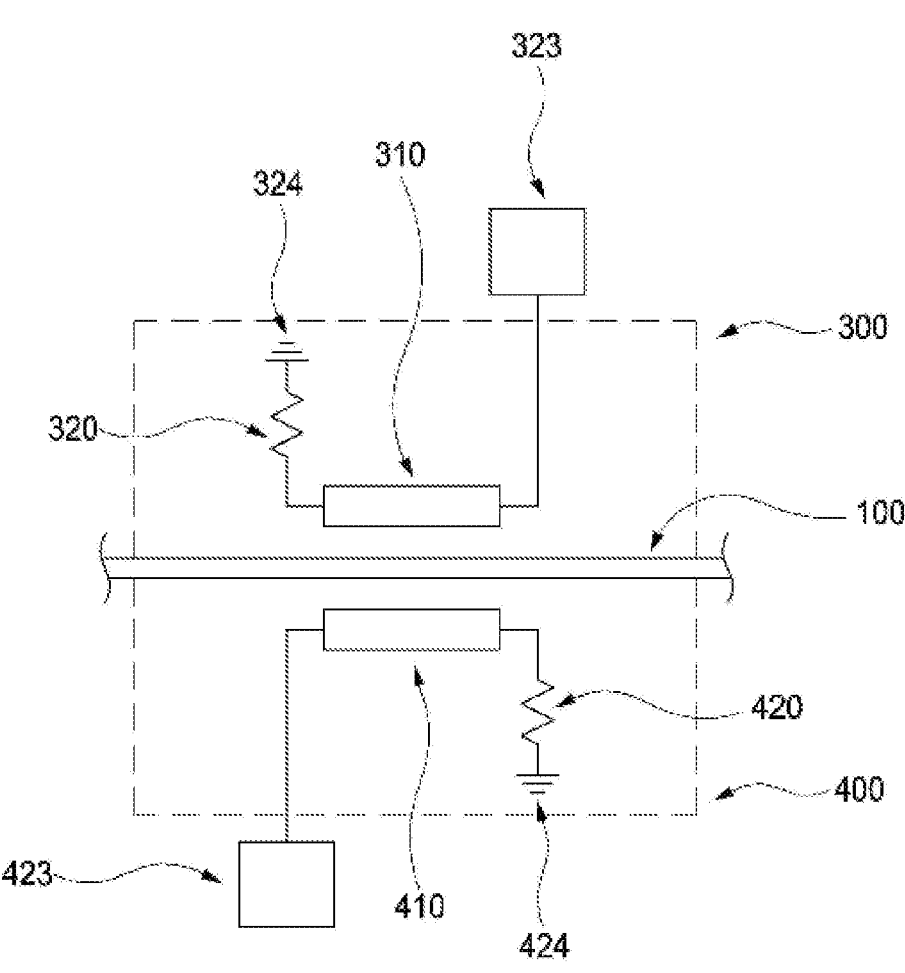
FIG. 7 is an equivalent circuit diagram illustrating a first directional coupler and a second directional coupler of the current/voltage/power measurement module.
Figure 8:
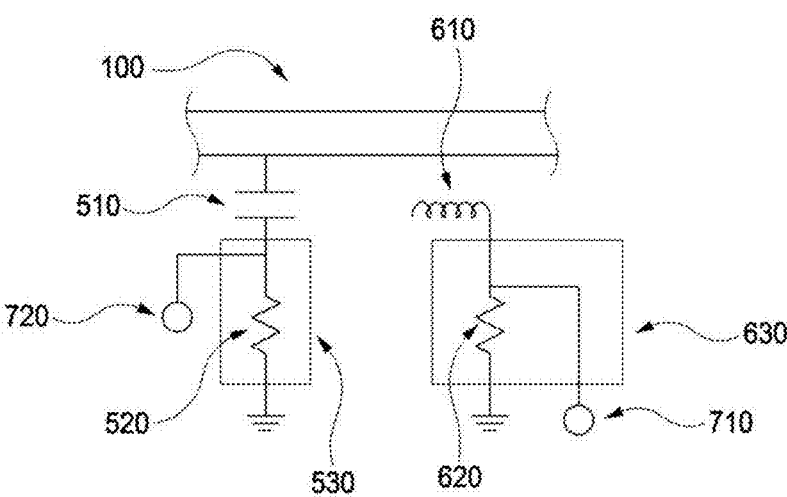
FIG. 8 is an equivalent circuit diagram illustrating a power measurement unit and a voltage measurement unit of the current/voltage/power measurement module.

For example, as shown in FIGS. 7 and 8, the current/voltage/power measurement module 200 according to the present invention may include: a first directional coupler 300 disposed adjacent to the application line to measure power output by the incident wave; a second directional coupler 400 disposed adjacent to the application line to measure power output by the reflected wave; a voltage measurement unit 500 disposed adjacent to the application line 100 to measure the RF voltage by using the capacitance principle; and a current measurement unit 600 disposed adjacent to the application line 100 to measure the RF current by using the inductance principle.

The voltage measurement unit 500 that is a component disposed adjacent to the application line 100 to measure the RF voltage by using the capacitance principle may have various configurations.

For example, as shown in FIG. 8, the voltage measurement unit 500 may include a capacitance part 510 disposed adjacent to the application line 100 and a third output port part 720 connected to the capacitance part 510 to measure the voltage of the incident wave.

The capacitance part 510 that is a component disposed adjacent to the application line 100 may be installed with a predetermined distance at an outer circumferential surface of the application line 100 and made of a capacitor conductor such as a copper material, which constitutes a capacitor in a circuit. The capacitance part 510 may have various configurations.

Here, a dielectric material for adjusting a dielectric constant may be formed between the outer circumferential surface of the application line 100 and the capacitor conductor.

The third output port part 720 that is a component connected to the capacitance part 510 to measure a voltage of the incident wave applied to the application line 100 may have various configurations.

Particularly, the third output port part 720 may have a wire shape formed at an edge of a PCB 220 that will be described later.

Also, the third output port part 720 may be connected to a central point based on a length of the capacitance part 510.

On the other hand, at least one of a resistance element part 520 and a third filter part 530 may be installed between a first ground part 740 and a branch point between the third output port part 720 and the capacitance part 510.

The first ground part 740 is a component for grounding through coupling with an external terminal and may be configured similarly to the ground terminal described later.

Each of the resistance element part 520 and the third filter part 530 is an electrical element that stably measures the voltage of the incident wave by an electrical signal output to the third output port part 720. The third filter part 530 may include a combination of a resistor, a capacitor, a coil, and the like.

The current measurement unit 600 that is a component disposed adjacent to the application line 100 to measure the RF current by using the inductance principle may have various configurations.

For example, as shown in FIG. 8, the current measurement unit 600 may include an inductance part 610 disposed adjacent to the application line 100 and a fourth output port part 710 connected to the inductance part 610 to measure the current flowing through the application line 100.

The inductance part 610 that is a component disposed adjacent to the application line 100 may be installed with a predetermined distance at an outer circumferential surface of the application line 100 and made of an inductance wire such as copper material, which constitutes an inductance in a circuit. The inductance part 610 may have various configurations.

The fourth output port part 710 that is a component connected to the inductance part 610 to measure the current flowing through the application line 100 may have various configurations.

Particularly, the fourth output port part 710 may have a wire shape formed at the edge of the PCB 220 that will be described later.

Also, the fourth output port part 710 may be connected to one end based on a length of the inductance part 610.

On the other hand, at least one of a resistance element part 620 and a fourth filter part 630 may be installed between a second ground part 730 and a branch point between the fourth output port part 710 and the inductance part 610.

The second ground part 730 that is a component for grounding through coupling with an external terminal may have a configuration similar to that of a ground terminal that will be described later.

Each of the resistance element part 620 and the fourth filter part 630 is an electrical element that stably measures the voltage of the incident wave by an electrical signal output to the fourth output port part 710. The fourth filter part 630 may include a combination of a resistor, a capacitor, a coil, and the like.

The first directional coupler 300 that is a component disposed adjacent to the application line to measure power output by the incident wave may have various configurations.

For example, as shown in FIG. 8, the first directional coupler 300 may include: a LC combination circuit part 310 in which a capacitance element 311 and an inductance element 312, which are disposed adjacent to the application line 100 and interact with the application line 100, are combined and which is wound based on a direction of the incident wave flowing through the application line 100; and a resistance element part 320 including a first reference resistance element 321 having one end that is grounded and the other end connected to one end of the LC combination circuit part 310 and a second reference resistance element 322 having one end connected to a first output port 323 and the other end connected to one end of the LC combination circuit unit 310.

The LC circuit combination unit 310 that is a component in which the capacitance element 311 and the inductance element 312, which are disposed adjacent to the application line 100 and interact with the application line 100, are combined and which is wound based on the direction of the incident wave flowing through the application line 100 may have various configurations such as the combination of the capacitance element 311 and the inductance element 312.

Particularly, the inductance element 312 may have a winding structure of a counterclockwise direction based on a forward direction of the incident wave, i.e., a traveling direction of the incident wave in consideration of measuring power of the incident wave.

Also, when the capacitance element 311 and the inductance element 312 form one coil as a whole in consideration of forming a structure merged with each other, a plate surface may be formed in a direction toward an outer circumferential surface of the application line 100 so that a portion of the coil forms the capacitor.

The LC combination circuit part 310 may be combined with the capacitance element 311 and the inductance element 312 to form one circuit.

The resistance element part 310 that is a component including the first reference resistance element 321 having one end that is grounded and the other end connected to one end of the LC combination circuit part 310 and the second reference resistance element 322 having one end connected to the first output port 323 and the other end connected to one end of the LC combination circuit unit 310 may have various configurations.

The first reference resistance element 321 that is a component having one end that is grounded and the other end connected to one end of the LC combination circuit unit 310 may have a preset resistance value, e.g., 50Ω.

Here, when the first reference resistance element 321 is installed on the PCB 220, the first reference resistance element 321 may be formed with a shape of a ground terminal 324 at an edge of the PCB 220 that will be described later.

The second reference resistance element 322 that is a component having one end connected to the first output port 323 and the other end connected to one end of the LC combination circuit unit 310 may have a preset resistance value, e.g., the same resistance value as the first reference resistance element 321.

Here, the first output port part 323 may be formed as a terminal at the edge of the PCB 220 that will be described later.

On the other hand, the first directional coupler 300 may have at least one filter part 330 installed at a branch point branched between the resistance element part 320 and the LC combination circuit part 310.

The filter unit 330 that is an electric element installed at a branch point branched between the resistance element part 320 and the LC combination circuit part 310 may include a capacitor, a coil, and the like.

The second directional coupler 400 that is a component disposed adjacent to the application line to measure power output by the reflected wave may have various configurations.

For example, as shown in FIG. 8, the second directional coupler 400 may include: a LC combination circuit part 410 in which a capacitance element 411 and an inductance element 412, which are disposed adjacent to the application line 100 and interact with the application line 100, are combined and which is wound based on a direction of the reflected wave flowing through the application line 100; and a resistance element part 420 including a third reference resistance element 421 having one end that is grounded and the other end connected to one end of the LC combination circuit part 410 and a fourth reference resistance element 422 having one end connected to a second output port 423 and the other end connected to one end of the LC combination circuit unit 410.

The LC combination circuit part 410 that is a component combined with the capacitance element 411 and the inductance element may have various configurations.

Particularly, the inductance element 412 may have a winding structure of a counterclockwise direction based on a forward direction of the reflected wave, i.e., a traveling direction of the reflected wave in consideration of measuring power of the reflected wave, in which since the incident wave and the reflected wave are in opposite directions, the winding direction of the inductance element 312 of the first directional coupler 300 is opposite to the winding direction of the inductance element 412 of the second directional coupler 400.

Also, when the capacitance element 411 and the inductance element 412 form one coil as a whole in consideration of forming a structure merged with each other, a plate surface may be formed in a direction toward an outer circumferential surface of the application line 100 so that a portion of the coil forms the capacitor.

The LC combination circuit part 410 may be combined with the capacitance element 411 and the inductance element 412 to form one circuit.

The resistance element part 420 that is a component including the third reference resistance element 421 having one end that is grounded and the other end connected to one end of the LC combination circuit part 410 and the fourth reference resistance element 422 having one end connected to the second output port 423 and the other end connected to one end of the LC combination circuit unit 410 may have various configurations.

The third reference resistance element 421 that is a component having one end that is grounded and the other end connected to one end of the LC combination circuit unit 410 may have a preset resistance value, e.g., 50Ω.

Here, when the third reference resistance element 421 is installed on the PCB 220, the third reference resistance element 421 may be formed with a shape of a ground terminal 424 at an edge of the PCB 220 that will be described later.

The fourth reference resistance element 422 that is a component having one end connected to the second output port 423 and the other end connected to one end of the LC combination circuit unit 410 may have a preset resistance value, e.g., the same resistance value as the third reference resistance element 421.

Here, the second output port part 423 may be formed as a terminal at the edge of the PCB 220 that will be described later.

On the other hand, the second directional coupler 400 may have at least one filter part 430 installed at a branch point branched between the resistance element part 420 and the LC combination circuit part 410.

The filter unit 430 that is an electric element installed at a branch point branched between the resistance element part 420 and the LC combination circuit part 410 may include a capacitor, a coil, and the like.

On the other hand, the current/voltage/power measurement module of the plasma apparatus according to the present invention having the above-described configuration may be configured as one module by including one PCB 220.

That is, the current/voltage/power measurement module of the plasma apparatus according to the present invention may include the PCB 220 in which an insertion part 210 having an inner diameter greater than an outer diameter of the application line 100 so that at least a portion of the application line 100 is inserted thereto.

The insertion part 210 may have various shapes such as an arc or circle in which one side is opened in consideration that the application line 100 has a circular cross-sectional shape so that the capacitance elements 311 and 411 and the inductance elements 312 and 412, which will be described later, have the same condition as each other.

Alternatively, the insertion part 210 may have a polygonal shape depending on conditions such as a condition in which the application line 100 has a rectangular cross-sectional shape.

As shown in FIGS. 2 to 5, the capacitance element 311 of the first directional coupler 300 and the capacitance element 411 of the second directional coupler 400 may include a plurality of capacitance parts 311a and 411a spaced apart from each other along a circumferential direction on an inner circumferential surface of the insertion part 210, and the inductance element 312 of the first directional coupler 300 and the inductance element 412 of the second directional coupler 400 may include winding parts 340 and 440 passing through the PCB 220 and wound at least one time to connect the capacitance parts 311a and 411a to an end thereof.

In an embodiment, the capacitance element 311 of the first directional coupler 300 and the capacitance element 411 of the second directional coupler 400 may include a plurality of capacitance parts 311a and 411a arranged along a predetermined arc angle on an inner circumferential surface of the insertion part 210 and made of a conductive material such as copper.

The plurality of capacitance parts 311a and 411a may each have a rectangular shape in an unfolded state and spaced a predetermined distance from each other along the inner circumferential surface of the insertion part 210.

The inductance element 312 of the first directional coupler 300 and the inductance element 412 of the second directional coupler 400 may include the winding parts 340 and 440 passing through the PCB 220 and wound at least one time to connect the capacitance parts 311a and 411a to the end. The winding parts 340 and 440 may have various configurations depending on coil winding structures.

In an embodiment, the winding parts 340 and 440 may include vertical connection part 850 that passes through metal pattern parts 810, 820, 830, and 840 formed on top and bottom surfaces of the PCB 220 and the PCB 220 in a vertical direction to electrically connect the metal pattern parts 810, 820, 830, and 840.

The metal pattern parts 810, 820, 830, and 840 that are metal patterns formed on the top and bottom surfaces of the PCB 220 to form one coil together with the vertical connection part 850 may include various patterns.

For example, the metal pattern parts 810, 820, 830, and 840 may include: a first upper component 810 disposed at a rear end of the capacitance part 311a in a clockwise direction and extending radially from the top surface of the PCB 220 and having a first connection point 811 at an end thereof; a first lower component 820 disposed at a front end of the capacitance part 311a in the clockwise direction and extending radially from the bottom surface of the PCB 220 and having a second connection point 821 at an end thereof; a second lower component 830 connecting a third connection point 832 set directly below the first connection point 811 to a fourth connection point 831 set on the bottom surface of the PCB 220 between the adjacent capacitance parts 311a in the clockwise direction; and a second upper component 840 connecting a fifth connection point 841 disposed directly above the third connection point 831 to a sixth connection point 842 set directly above the second connection point 821.

The first upper component 810, the second upper component 840, the first lower component 820, and the second lower component 830, which are made of a conductive material such as copper and disposed on the top and bottom surfaces of the PCB 220, may form an inductance component as a whole together with the capacitance parts 311a and 411a and the vertical connection part 850 that will be described later and may have various configurations.

On the other hand, the first connection point 811 to the sixth connection point 842 that are points set as portions to which the first upper component 810, the second upper component 840, the first lower component 820, and the second lower component 830 are vertically connected may have various configurations depending on structures in which the vertical connection part 850 is connected to the first upper component 810, the second upper component 840, the first lower component 820, and the second lower component 830.

Particularly, the fifth connection point 841 and the fourth connection point 831 may be formed closer to the inner peripheral surface of the insertion part 210 than the first connection point 811 and the second connection point 821.

The vertical connection part 850 that is a component that passes through the PCB 220 in the vertical direction and electrically connects the metal pattern parts 810, 820, 830, and 840 to each other may include a plurality of connection members 850 that vertically and electrically connect the first connection point 811 and the third connection point 832, the sixth connection point 842 and the second connection point 821, and the fifth connection point 841 and the fourth connection point 831.

On the other hand, as shown in FIGS. 2 to 5, a metal pattern part 441 and a vertical connection part 442 of the second directional coupler 400 are linearly symmetrical based on a center of the insertion part 210 with respect to the metal pattern parts 810, 820, 830, and 840 and the vertical connection part 850. A detailed description thereof will be omitted.

For reference, since the inductance component of the second directional coupler 400 is opposite to the inductance component of the first directional coupler 300, when the first directional coupler 300 is formed based on the clockwise direction, the second directional coupler 400 is formed based on the counterclockwise direction.

On the other hand, in the PCB 220, the LC combination circuit parts 310 and 410 of the first directional coupler 300 and the second directional coupler 400 may be formed on one side, and the resistance element parts 320 and 420 and at least a portion of the filter parts 330 and 430, which are remained components, may be formed on the other side.

Also, the PCB 220 having the above-described configuration may have a rectangular planar shape and be divided into a first area on which the LC combination circuit parts 310 and 410 and the insertion part 210 are formed and a second area which contacts the first area and on which the resistance element parts 320 and 420 are disposed.

The LC combination circuit parts 310 and 410 disposed on the first area and the resistance element parts 320 and 420 disposed on the second area may be electrically connected by at least one wire pattern 390 and 490 formed on at least one of the top and bottom surfaces of the PCB 220.

Particularly, the wire patterns 390 and 490 may be appropriately arranged on the top and bottom surfaces of the PCB 220 to effectively connect the LC combination circuit parts 310 and 410 disposed on the first area and the resistance element parts 320 and 420 disposed on the second area.

Also, at least one wire pattern 240 may be formed on at least one of the top and bottom surfaces to block an electromagnetic wave from the first area on which the LC combination circuit parts 310 and 410 are disposed between the first area and the second area.

Also, the voltage measurement unit 500 may be integrated into the PCB 220.

Specifically, the capacitance part 510 may be formed along a circumferential direction at a predetermined angle on at least one of the inner circumferential surface of the insertion part 210 and the top and bottom surfaces of the edge of the insertion part 210 on the first area of the PCB 220.

Here, the capacitance part 510 may be disposed between the capacitance element 311 of the LC combination circuit unit 310 of the first directional coupler 300 and the capacitance elements 311 of the LC combination circuit unit 410 of the second directional coupler 400 based on the circumferential direction of the insertion unit 210.

Also, the resistance element part 520 may be installed on the second area of the PCB 220.

Also, the resistance element part 520 may be electrically connected by a wire pattern 590 formed on at least one of the top and bottom surfaces of the PCB 220 and the capacitance part 510.

Also, the third filter part 530 may be disposed at an arbitrary point on the PCB 220, which is a branch point branched between the resistance element part 520 and the capacitance part 510, particularly a branch point branched from the wire pattern 590.

Also, the current measurement unit 600 may be integrated into the PCB 220.

The inductance part 610 may be formed on the first area by passing through the PCB 220 in concentric with the voltage measurement unit 500 further away from the voltage measurement unit 500 based on the inner circumferential surface of the insertion part 210 and winding at least one time.

Specifically, the inductance part 610 may include: a plurality of upper components 611 extending in a radial direction of the insertion part 210 and spaced a distance from each other in the circumferential direction on the top surface of the PCB 220; a lower component that connects a first lower connection point passing through the PCB 220 in the vertical direction at a first upper connection point of one end of the upper component 611 and a second lower connection point at the other end of the adjacent upper component 611; a first connection part 613 that electrically connects the first upper connection point and the first lower connection point in the vertical direction; and a second connection part 614 that vertically and electrically connects a second upper connection point to a second lower connection point that passes through the PCB 220 in the vertical direction from the second upper connection point.

Also, the resistance element part 620 may be installed on the second area of the PCB 220.

Also, the resistance element part 620 may be electrically connected by a wire pattern 690 formed on at least one of the top and bottom surfaces of the PCB 220 and the inductance part 610.

Also, the fourth filter part 630 may be disposed at an arbitrary point on the PCB 220, which is a branch point branched between the resistance element part 620 and the inductance part 610, particularly a branch point branched from the wire pattern 690.

On the other hand, in the PCB 220, the first output port 323, the ground terminal 324, the second output port 423, the ground terminal 424, the first ground part 740, the second ground part 730, the third output port 710, and the fourth output port 720 may be formed with a terminal shape at an edge in the second area.

The terminal formed on the PCB 220 may be connected to an external module and output electrical signals through each output port 323, 423, 710, and 720 to measure the current/voltage/power.

The current/voltage/power measurement module 200 according to the present invention having the above-described configuration may measure the power of the incident wave and the reflected wave by using the first directional coupler 300 and the second directional coupler 400.

However, since electrical signals output through the first directional coupler 300 and the second directional coupler 400 are output with a lot of noise, extraction and examination on the signals are required.

Accordingly, the current/voltage/power measurement module 200 according to the present invention may measure the current, the voltage, and the power of the incident wave and the reflected wave applied to the application line 100 through a lookup table and a relational equation obtained through experiments performed in advance according to process conditions.

Although the voltage measurement unit 500, the current measurement unit 600, the first directional coupler 300 for measuring the power of the incident wave, and the second directional coupler 400 for measuring the power of the reflected wave are all included in the present invention, the present invention may include only one of the voltage measurement unit 500, the current measurement unit 600, the first directional coupler 300 for measuring the power of the incident wave, and the second directional coupler 400 for measuring the power of the reflected wave as necessary.

Particularly, the present invention may realize at least one of the voltage measurement unit 500, the current measurement unit 600, the first directional coupler 300 for measuring the power of the incident wave, and the second directional coupler 400 for measuring the power of the reflected wave into one PCB as necessary.

The current/voltage/power measurement module of the plasma apparatus according to the present invention and the plasma apparatus including the same may measure the voltage and current generated by applying the RF power and forming the plasma and further measure the power of the incident and reflected waves by using an LC combination circuit to measure the state of plasma generated in the processing space for substrate processing, thereby performing plasma control for performing the process.

Specifically, the current/voltage/power measurement module of the plasma apparatus according to the present invention and the plasma apparatus including the same may measure the current/voltage/power applied for generating and maintaining the plasma to accurately control the plasma for performing the process by including the first directional coupler for measuring the power of the reflected wave and the second directional coupler for measuring the power of the incident waves in addition to the component for measuring the current and voltage.

Furthermore, the current/voltage/power measurement module of the plasma apparatus according to the present invention and the plasma apparatus including the same may measure the current/voltage/power applied for generating and maintaining the plasma to accurately control the plasma for performing the process through the simple structure by realizing the components for measuring the current/voltage applied to generate and maintain the plasma and power of the incident and reflected waves into one PCB.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A module for measuring current/voltage/power of a plasma apparatus, wherein the module is configured to be used with the plasma apparatus, the plasma apparatus comprising:

a process chamber having a sealed processing space in which plasma is formed;

a substrate support unit disposed in the processing space; and a gas injection unit configured to inject gas into the processing space, wherein the module is configured to be disposed adjacent to at least one application line among a first power application line and a ground line of the plasma apparatus to measure an RF voltage, current, and power of an input wave and a reflected wave, and wherein the module comprises:

a first directional coupler disposed adjacent to the application line to measure power output by the input wave;

a second directional coupler disposed adjacent to the application line to measure power output by the reflected wave;

a voltage measurement unit disposed adjacent to the application line to measure the RF voltage by using capacitance; and a current measurement unit disposed adjacent to the application line to measure the RF current by using inductance.

2. The module of claim 1, wherein the first directional coupler and the second directional coupler comprise inductance elements having different winding directions.

3. The module of claim 2, wherein the first directional coupler comprises:

an LC combination circuit part in which a capacitance element and an inductance element, which are disposed adjacent to the application line and interact with the application line, are combined and which is wound based on a direction of an incident wave flowing through the application line; and a resistance element part comprising a first reference resistance element having one end that is grounded and another end connected to one end of the LC combination circuit part and a second reference resistance element having one end connected to a first output port and another end connected to the one end of the LC combination circuit unit, and the second directional coupler comprises:

an LC combination circuit part in which a capacitance element and an inductance element, which are disposed adjacent to the application line and interact with the application line, are combined and which is wound based on a direction of the reflected wave flowing through the application line; and a resistance element part comprising a third reference resistance element having one end that is grounded and another end connected to one end of the LC combination circuit part and a fourth reference resistance element having one end connected to a second output port and another end connected to the one end of the LC combination circuit unit.

4. The module of claim 3, wherein the first directional coupler comprises at least one filter part disposed at a branch point branched between the resistance element part and the LC combination circuit part, and the second directional coupler comprises at least one filter part installed at a branch point branched between the resistance element part and the LC combination circuit part.

5. The module of claim 3, further comprising a PCB in which an insertion part having an inner diameter greater than an outer diameter of the application line so that at least a portion of the application line is inserted therein, wherein a capacitance element of the first directional coupler and a capacitance element of the second directional coupler comprise a plurality of capacitance parts spaced apart from each other along a circumferential direction on an inner circumferential surface of the insertion part, and an inductance element of the first directional coupler and the inductance element of the second directional coupler comprise winding parts passing through the PCB and wound at least one time to connect the capacitance parts to an end thereof.

6. The module of claim 5, wherein the winding parts comprise metal pattern parts formed on top and bottom surfaces of the PCB and vertical connection parts passing through the PCB in a vertical direction to electrically connect the metal pattern parts.

7. The module of claim 6, wherein the current measurement unit comprises:

an inductance part passing through the PCB concentrically with the voltage measurement unit further away from the voltage measurement unit based on the inner circumferential surface of the insertion part and winding at least one time; and a fourth output port part connected to the inductance part.

8. The module of claim 7, wherein at least one of the resistance element part and the fourth filter part is disposed between a second ground part and a branch point between the inductance part and the fourth output port part.

9. The module of claim 5, wherein the voltage measurement unit comprises:

a capacitance part formed in a circumferential direction at a predetermined angle on at least one of an inner circumferential surface of the insertion part and top and bottom surfaces of an edge of the insertion part; and a third output port part connected to the capacitance part.

10. The module of claim 9, wherein at least one of a resistance element part and a third filter part is disposed between a first ground part and a branch point between the capacitance part and the third output port part.

11. A plasma apparatus comprising:

a process chamber having a sealed processing space in which plasma is formed; and a module for measuring current/voltage/power of the plasma apparatus, the module configured to measure an RF voltage, current, and power of an incident wave and a reflected wave generated by plasma generated in the processing space, wherein the module is the module according to claim 1.

12. The plasma apparatus of claim 11, wherein the first directional coupler and the second directional coupler comprise inductance elements having different winding directions.

13. The plasma apparatus of claim 12, wherein the first directional coupler comprises:

an LC combination circuit part in which a capacitance element and an inductance element, which are disposed adjacent to the application line and interact with the application line, are combined and which is wound based on a direction of the incident wave flowing through the application line; and a resistance element part comprising a first reference resistance element having one end that is grounded and another end connected to one end of the LC combination circuit part and a second reference resistance element having one end connected to a first output port and the another end connected to the one end of the LC combination circuit unit, and the second directional coupler comprises:

an LC combination circuit part in which a capacitance element and an inductance element, which are disposed adjacent to the application line and interact with the application line, are combined and which is wound based on a direction of the reflected wave flowing through the application line; and a resistance element part comprising a third reference resistance element having one end that is grounded and another end connected to one end of the LC combination circuit part and a fourth reference resistance element having one end connected to a second output port and the another end connected to the one end of the LC combination circuit unit.

14. The plasma apparatus of claim 13, wherein the first directional coupler comprises at least one filter part disposed at a branch point branched between the resistance element part and the LC combination circuit part, and the second directional coupler comprises at least one filter part installed at a branch point branched between the resistance element part and the LC combination circuit part.

15. The plasma apparatus of claim 13, further comprising a PCB in which an insertion part having an inner diameter greater than an outer diameter of the application line so that at least a portion of the application line is inserted therein, wherein a capacitance element of the first directional coupler and a capacitance element of the second directional coupler comprise a plurality of capacitance parts spaced apart from each other along a circumferential direction on an inner circumferential surface of the insertion part, and an inductance element of the first directional coupler and the inductance element of the second directional coupler comprise winding parts passing through the PCB and wound at least one time to connect the capacitance parts to an end thereof.

16. The plasma apparatus of claim 15, wherein the winding parts comprise metal pattern parts formed on top and bottom surfaces of the PCB and vertical connection parts passing through the PCB in a vertical direction to electrically connect the metal pattern parts.

17. The plasma apparatus of claim 16, wherein the current measurement unit comprises:

an inductance part passing through the PCB concentrically with the voltage measurement unit further away from the voltage measurement unit based on the inner circumferential surface of the insertion part and winding at least one time; and a fourth output port part connected to the inductance part.

18. The plasma apparatus of claim 17, wherein at least one of the resistance element part and the fourth filter part is disposed between a second ground part and a branch point between the inductance part and the fourth output port part.

19. The plasma apparatus of claim 15, wherein the voltage measurement unit comprises:

a capacitance part formed in a circumferential direction at a predetermined angle on at least one of an inner circumferential surface of the insertion part and top and bottom surfaces of an edge of the insertion part; and a third output port part connected to the capacitance part.

20. The plasma apparatus of claim 19, wherein at least one of a resistance element part and a third filter part is disposed between a first ground part and a branch point between the capacitance part and the third output port part.

* * * * *